US011139852B2

(12) United States Patent
Peeters et al.

(10) Patent No.: US 11,139,852 B2
(45) Date of Patent: Oct. 5, 2021

(54) SITUATIONAL AWARENESS OVER A LOW BANDWIDTH SHORT BURST DATA SATELLITE SYSTEM

(71) Applicant: Nortac Defence Limited, Ottawa (CA)

(72) Inventors: Giles Peeters, Orleans (CA); Guy Desbiens, Ottawa (CA); Saad Mirza, Stittsville (CA); Abdulganiyu Yusufu, Ottawa (CA); Ian Johnstone, Ottawa (CA); Osasumwen E. Igbinedion, Gloucester (CA); Matt Saab, Ottawa (CA); Jun Zhou, Ottawa (CA); Peter Pavlatos, Ottawa (CA)

(73) Assignee: Nortac Defence Limited, Ottawa (CA)

( * ) Notice: Subject to any disclaimer, the term of this patent is extended or adjusted under 35 U.S.C. 154(b) by 0 days.

(21) Appl. No.: 16/880,444

(22) Filed: May 21, 2020

(65) Prior Publication Data

US 2021/0006287 A1 Jan. 7, 2021

Related U.S. Application Data

(60) Provisional application No. 62/870,741, filed on Jul. 4, 2019.

(51) Int. Cl.
*H04B 1/66* (2006.01)
*H04W 28/06* (2009.01)
(Continued)

(52) U.S. Cl.
CPC ................ *H04B 1/66* (2013.01); *H03M 7/70* (2013.01); *H04B 7/18517* (2013.01);
(Continued)

(58) Field of Classification Search
CPC ....... H04B 1/66; H04B 7/18517; H03M 7/70; H04W 4/02; H04W 28/06; H04W 84/06
(Continued)

(56) References Cited

U.S. PATENT DOCUMENTS

| 6,839,350 B1 * | 1/2005 | Inouchi ............... H04L 12/4633 370/335 |
| 10,602,422 B1 * | 3/2020 | Jagannatha ......... H04L 41/5041 |

(Continued)

OTHER PUBLICATIONS

International Search Report for corresponding PCT application No. PCT/CA2020/050896.

*Primary Examiner* — Danh C Le
(74) *Attorney, Agent, or Firm* — Stratford Group Ltd.

(57) ABSTRACT

A message handler for receiving and transmitting positional information over a short burst data (SBD) service is provided. The message handler comprises a receiver for receiving packets with positional information from one or more mobile devices over the SBD service, a memory for storing the positional information, a transmitter for sending situational awareness packets to the one or more mobile devices, computer readable medium having computer readable instructions stored thereon for causing the message handler to receive the packets from the one or more mobile devices, store the positional information from the packets in the memory, select positional information based on parameters for the situational awareness packets, the selected positional information comprising at least longitude and latitude, heading and altitude for at least one mobile device, compress and combine the selected information to send in the situational awareness packets based on rules and send the situational awareness packets to the one or more mobile devices.

9 Claims, 16 Drawing Sheets

(51) Int. Cl.
*H04B 7/185* (2006.01)
*H03M 7/30* (2006.01)
*H04W 4/02* (2018.01)
*H04W 84/06* (2009.01)

(52) U.S. Cl.
CPC ............. *H04W 4/02* (2013.01); *H04W 28/06* (2013.01); *H04W 84/06* (2013.01)

(58) Field of Classification Search
USPC ................. 370/316, 310.2; 455/550.1, 456.4
See application file for complete search history.

(56) References Cited

U.S. PATENT DOCUMENTS

| | | | |
|---|---|---|---|
| 2003/0198346 A1* | 10/2003 | Meifu | H04W 4/029 380/258 |
| 2005/0065711 A1 | 3/2005 | Dahlgren et al. | |
| 2005/0239399 A1 | 10/2005 | Karabinis | |
| 2010/0014451 A1* | 1/2010 | Fujino | H04L 67/14 370/315 |
| 2010/0074253 A1 | 3/2010 | Cheriyath et al. | |
| 2012/0140665 A1* | 6/2012 | Li | H04W 72/087 370/252 |
| 2013/0120188 A1* | 5/2013 | Pattabiraman | H04W 72/005 342/357.29 |
| 2013/0324124 A1* | 12/2013 | Scribano | H04W 48/18 455/435.3 |
| 2014/0211714 A1* | 7/2014 | Li | H04L 41/0893 370/329 |
| 2016/0255463 A1* | 9/2016 | Das | H04W 64/00 455/456.1 |
| 2018/0176902 A1 | 6/2018 | Huang et al. | |
| 2018/0367272 A1 | 12/2018 | Wang et al. | |
| 2020/0214054 A1* | 7/2020 | Qiao | H04W 48/18 |
| 2020/0348662 A1* | 11/2020 | Cella | G05B 23/0289 |
| 2021/0075915 A1* | 3/2021 | Qiao | H04W 4/24 |

* cited by examiner

| BIT POS | BITS LEN | TYPE | DESCRIPTION |
|---|---|---|---|
| 1 | 2 | Micro | 0xC |
| 3 | 1 | 2 BYTES COMM_ID | 1=TRUE, 0=FALSE |
| 4 | 8 \|\| 16 | COMM_ID | Unique identifier |
| 12 \|\| 20 | 3 | DATE | Day of week (Sunday=0, Monday=1,...Saturday=6) |
| 15 \|\| 23 | 17 | TIME | Seconds since midnight. 0 to 86399 |
| 32 \|\| 40 | 1 | POSITIONING | 1=TRUE, 0=FALSE |
| Optional Positioning | | | |
| 33 \|\| 41 | 1 | LAT SIGN | 0=SOUTH, 1=NORTH |
| 34 \|\| 42 | 21 | LATITUDE | Encoding: 45.37363*23301=0x1021E3 Decoding: 0x1021E3/23301=45.37363 |
| 55 \|\| 63 | 1 | LON SIGN | 0=West, 1=EAST |
| 56 \|\| 64 | 22 | LONGITUDE | Encoding: 45.37363*23301=0x1021E2 Decoding: 0x1021E2/23301=45.37359 |
| 78 \|\| 86 | 1 | ALERT | 1=TRUE, 0=FALSE |
| 79 \|\| 87 | 1 | SPEED / HEADING | 1=TRUE, 0=FALSE |
| 80 \|\| 88 | 1 | ALTITUDE | 1=TRUE, 0=FALSE |
| Optional Speed & Heading | | | |
| 81 \|\| 89 | 11 | SPEED | 0 to 2047 KM/H |
| 92 \|\| 100 | 3 | HEADING | 0=North, 1=North-East...7=North-West |
| 95 \|\| 103 | 2 | SPARE | |
| Optional Altitude | | | |
| 97 \|\| 105 | 8 | ALTITUDE | 0 to 50=0 to 1000m (every 20 meters) 51 to 230=1050 to 10000m (every 50 meters) 231 to 255=10.5 to 22.5km (every 500 meters) |

FIG. 5

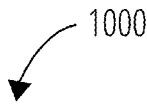

| BIT POS | BITS LEN | TYPE | DESCRIPTION |
|---|---|---|---|
| 1 | 16 | COMM_ID | 0 to 65535 |
| 17 | 3 | TYPE | 0=user, 1=asset, 2=asset group, 3=SMS, 4=Email |
| 20 | 1 | NAME INCLUDED | 1=included, 0=N/A |
| 21 | 1 | PLATFORM ENABLED | 1=included, 0=N/A |
| 22 | 1 | SMS ENABLED | 1=included, 0=N/A |
| 23 | 1 | EMAIL/SMS INCLUDED | 1=included, 0=N/A |
| 24 | 1 | Spare | Spare |
| Optional: (For users, assets, and asset groups) | | | |
| 25 | 8 | NAME LENGTH | 1 to 200 |
| 33 | 8 to 1600 | NAME | UTF8, up to 50 chars (200 bytes) |
| Optional Email or SMS info: | | | |
| 41 | 8 | EMAIL/SMS LENGTH | 1 to 50 |
| 49 | 8 to 400 | EMAIL ADDRESS/SMS # | up to 50 chars (50 bytes) |

FIG. 10

SITUATIONAL AWARENESS OVER A LOW BANDWIDTH SHORT BURST DATA SATELLITE SYSTEM

CROSS-REFERENCE TO RELATED APPLICATIONS

This application claims priority to U.S. Provisional Application No. 62/870,741, filed Jul. 4, 2019, which is hereby incorporated by reference herein in its entirety.

FIELD OF THE INVENTION

The present disclosure relates to the transmission of data over a low bandwidth short burst data (SBD) satellite system, in particular the transmission of data needed for situational awareness (SA).

BACKGROUND

The Short Burst Data (SBD) service is a low-cost satellite communication system covering the entire surface of the Earth. Example SBD services include but are not limited to Iridium, Globalstar, Immarsat and Thuraya. The SBD service has a very low bandwidth (Approx. 1 kbps), even lower than the bandwidth of dial up modems of the 1980's and that is if signal quality is good. In a typical condition where the signal quality is excellent, the short burst data service can deliver up to 6 packets, each comprising from 1 to 270 bytes for mobile terminated communication. If data is in the range of 10 bytes, 60 bytes per minutes is possible. If each packet is fully maximized, 1620 bytes per minutes or 216 bps is possible. For a comparison, high speed dial up modems in 1995 were achieving 56,000 bps. Thus, while the SBD service provides worldwide coverage, the amount of data that can be transmitted is very limited.

Situational awareness refers to the ability, usually by military personal, to locate, in a 3-dimensional positioning, assets such as friendly forces. Assets refer herein to any GPS receiver that can report its position (location data and time) using the SBD service and/or cellular.

Situational awareness generally uses the SBD service and involves a lot of data exchange. Because the information is exchanged in short bursts, using compression utilities, like Winzip™, would have the counter effect of increasing the data size. There is therefore a need to reduce the size of data transmission used in situational awareness.

BRIEF SUMMARY

It is the object of the present invention to provide a message handler for receiving and transmitting positional information over a short burst data (SBD) service.

In accordance with an aspect of the invention, there is provided a message handler comprising a receiver for receiving packets with positional information from one or more mobile devices over the SBD service, a memory for storing the positional information, a transmitter for sending situational awareness packets to the one or more mobile devices, computer readable medium having computer readable instructions stored thereon for causing the message handler to receive the packets from the one or more mobile devices, store the positional information from the packets in the memory, select positional information based on parameters for the situational awareness packets, the selected positional information comprising at least longitude and latitude, heading and altitude for at least one mobile device, compress and combine the selected information to send in the situational awareness packets based on rules and send the situational awareness packets to the one or more mobile devices.

In accordance with an embodiment of the invention, the heading information is divided by a fraction of 360 degree in order to compress data.

In accordance with an embodiment of the invention, the longitude and the latitude are compressed to 22 bits each.

In accordance with an embodiment of the invention, the altitude is compressed to 8 bits.

In accordance with an embodiment of the invention, the altitude is compressed using 3 ranges.

In accordance with an embodiment of the invention, the ranges are not linear.

In accordance with an embodiment of the invention, the most recent position information is sent first in the situational awareness packets.

In accordance with an embodiment of the invention, the position information is received from an asset only at predetermined intervals.

In accordance with an embodiment of the invention, the position information is received from an asset if said asset has moved more than a predetermined distance.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 illustrates an SA message 500 in accordance with one embodiment.

FIG. 10 illustrates a Contact synchronization 1000 in accordance with one embodiment.

DETAILED DESCRIPTION

The details of one or more embodiments of the subject matter of this specification are set forth in the accompanying drawings and the description below. Other features, aspects, and advantages of the subject matter will become apparent from the description, the drawings, and the claims.

Like reference numbers and designations in the various drawings indicate like elements.

The present disclosure provides a method of transmitting location information of one or more assets over a SBD service, such as the Iridium SBD. For the purposes of this disclosure, an asset is a GPS receiver that communicates over a SBD service. The disclosed embodiment enables situational awareness (SA) using the SBD service in a manner that uses very little bandwidth so as to provide as close to real time data as possible. In general, the packets contain the location information in a format that compresses some data, is selective on what data to include and how accurate the data is and positions the most important data at the beginning of the packet.

Non-limiting examples of assets are Wave™, Whisper™, Shadow™, Echo™ Garmin™ and NAL Research™ GPS receivers.

Figure 1:
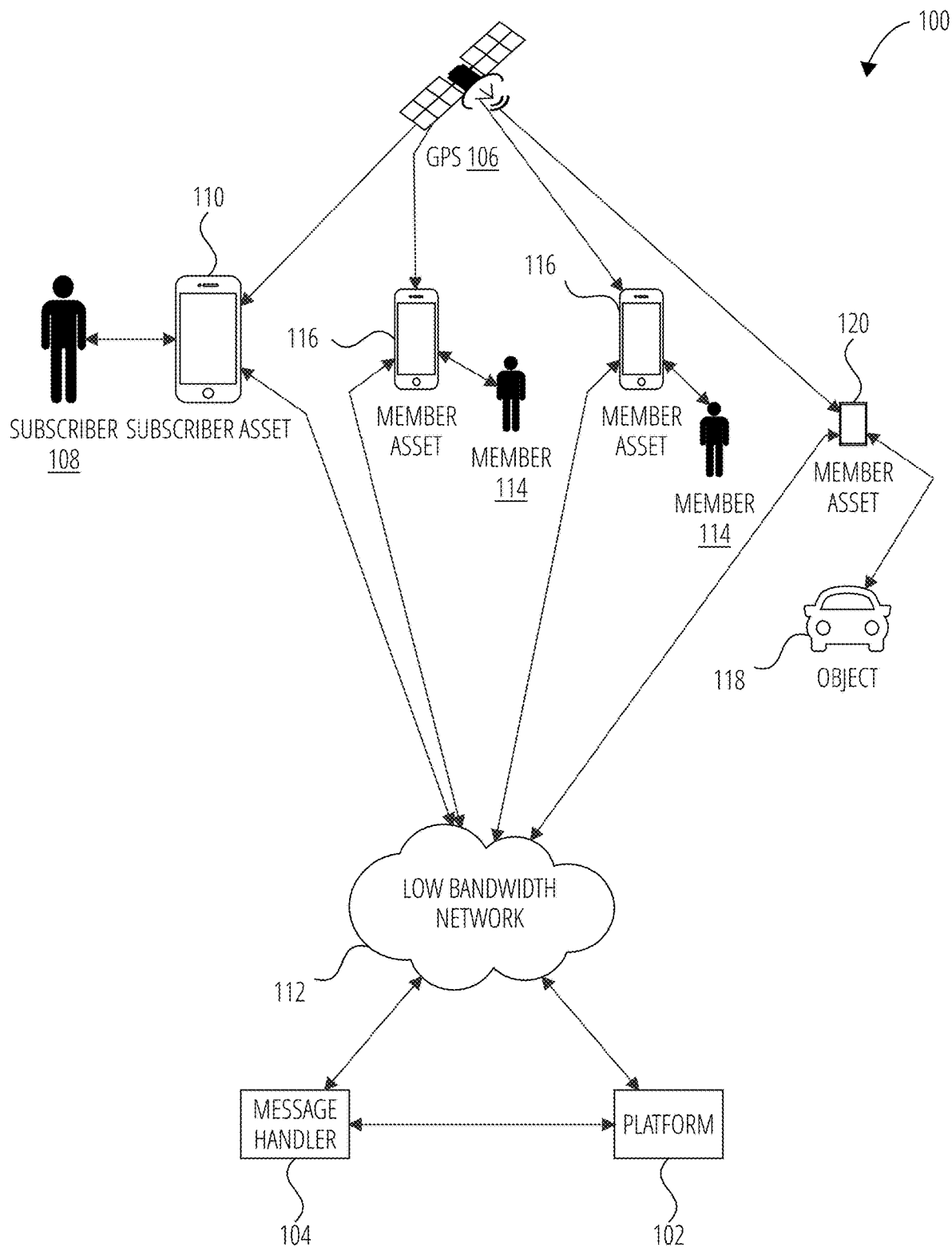
FIG. 1 illustrates an architecture for situational awareness 100 in accordance with one embodiment.

FIG. 1 depicts an architecture for situational awareness 100:

A subscriber 108 is a user of a subscriber asset 110 that is tracking the position of one or more other member asset 116 or member asset 120 used by a member 114 or an object 118 respectively, using SA with one objective, for example, increasing safety and to support operations. Typically, SA should be updated often since all tracked assets may move relatively fast and therefore near real-time information is often required. Note that a member 114 may be carrying a member asset 116 or the member asset 120 can be located on an object 118 such as a vehicle.

One or more members 114, objects 118 carrying member assets 116, 120 are in relation to a subscriber 108 who displays a collection of tracks relating to the GPS 106 position of the members 114, objects 118.

Each subscriber 108 and member 114 sends positional information over the low bandwidth network 112 in an efficient way that does not saturate the bandwidth.

A message handler 104 receives and parses data, then combines positional information to fill a maximum packet size but also implements various mechanics to send important data but also respecting time threshold. The message handler 104 also implements various mechanics to send only necessary data respecting time. The collection of data is highly compressed using adaptive methodology described herein. In some embodiments, the message handler 104 is located in a hosted facility where a few customers are grouped on the same server. In other embodiments, a platform license is provided to a customer for installation on their own server.

The subscriber asset 110 receives and parses the SA data packet and maintains data related to a collection of assets within memory. The SA can be display on a mobile device in a data list or a radar type display, which require less memory and data transfer than a map.

An address book is dynamically maintained on an SA asset which contains subscriber 108 information which should not be included on each SA report since the data is large and repetitive. In some embodiments the address book is maintained on a system platform 102 and is synced over the satellite to each subscribers' 108 mobile device.

The message handler 104 keeps the latest position report of all member assets 116, 120 that have reported at least once. Occasionally, the message handler 104 must send a location for each member asset 116, 120 subscribed based on the following conditions:

1. If an asset has reported for the first time to the platform 102, the message handler 104 sends a full collection of member assets 116, 120.
2. If a member asset 116, 120 has been offline for a long period of time, a full SA collection is also needed.

Situational Awareness Configuration:

To setup a subscriber 108 with SA capabilities, the user on the platform 102 needs to select related member assets 116, 120 in the subscribers' 108 list. Based on this list, the message handler 104 filters all locations received from the SBD network and collects situational positional information for the member assets 116, 120.

The message handler 104 stores a new position in the collection of positional information if the member asset 116, 120 has moved more than a predefined distance from its last GPS report.

The message handler 104 sends the collection of positional information at intervals. The message handler 104 sends the position information right away if the maximum packet size is reached or when the interval threshold is reached which is calculated from the time of first packet stored in collection of positional information and current real time clock.

Collection of Positional Information:

The message handler 104 combines position information which needs to be compressed and keeps an individual list for each SA subscriber 108 based on the following criteria when one position report is received:

1. If subscribed to a member asset 116, 120, store or build upon a short SA report of 4 bytes if the member asset 116, 120 has not moved. This short report contains a unique id (COMM_ID), day of week, and time of position taken. This increases to 5 bytes if the COMM_ID is greater than 255.
2. Store a longer report if the asset has moved by a distance threshold. The longer report is adaptive based on parameters that are available. (10 to 14 bytes)
3. Store a long report if the emergency status (alert) has changed.
4. When storing positional information, the message handler 104 checks if the COMM_ID is present in the existing collection of positional information. If yes, it discards the older report and replaces it with the newest one.

Combining Packets

Satellite signals are weak and vary from none to excellent based on line of view with a satellite. This satellite constellation is in low earth orbit which requires an orbit time of approximately 90 minutes. If the user sets a device in a fixed position where the signal is excellent, the signal quality quickly deteriorates since the satellite are moving fast. Since the signal can be weak for a period of time, the disclosed method adds to a combined packet in a way that satisfies the SA functionality without losing data. Therefore, critical real time information is not lost, it is only the latency of that data that is compromised due to lack of satellite signal.

Byway of example, the Iridium SBD network is limited to about 6 packets per minute in typical excellent conditions. If 12 GPS 106 reports of 8 bytes are queued and sent individually, this would take 2 minutes or worse if signal quality is marginal. When combining many packets into one packet, these 12 GPS 106 reports take less than 10 seconds to reach the platform.

In the disclosed method, the following rule is followed: the latest position report is in front of the packet. This will allow the message handler 104 to process the SA faster. All other position reports are discarded in the message handler 104 for the SA but kept on the platform 102 for historical replay. In one example, the combined message has a maximum of 340 bytes payload imposed by the Iridium SBD network. For example, a mobile device could send a message to a satellite, the satellite then sends the message to the ground station, and the ground station forwards the message via an internet socket to the system server. The system server has to main components, the message handler 104, and the web platform 102. If a second combined message is needed, the latest position report must be part of the first combined message. The messages are queued when the signal quality with satellite network is poor. If the mobile device is in an area with physical blockage to satellite for long time, a second or more combined message is present in the mobile device.

Figure 2:
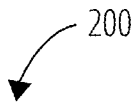
FIG. 2 illustrates a positional information 200 in accordance with one embodiment.

As per FIG. 2, positional information is sent when a member asset 116, 120 has a change in its 2-dimensional positioning or if a user has changed its emergency alerting status. This table presents an example of which parameters are important to trigger a location change:

1. Only if distance has changed by a configurable threshold in meters
2. Only when status changes from false to true or true to false It is also important to continue to report positional information but at a lesser rate if position is not triggered by location or alert changes since it is impossible for the SA collection to determine if a user has turned off the device or the asset is no longer moving.

Figure 3:
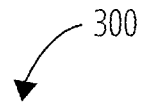
FIG. 3 illustrates a system configuration 300 in accordance with one embodiment.

FIG. 3 shows an example of the different system configuration as it relates to tracking.

Internally on the member asset 116, 120, the software analyzes the GPS 106 reported by the hardware every second. Two tracking modes are used in some embodiment of the disclosed method: a stationary tracking mode and a moving tracking mode.

Stationary tracking mode: If the time exceeds a configurable threshold (STATIONARY_REPORT_RATE) and device speed of a member asset 116, 120 is under the configurable threshold (SPEED_THRESHOLD), a position report (9-12 bytes) is sent by the member asset's 116, 120 mobile device to platform 102 (i.e. a server). In some embodiments, when the mobile device is not moving, the time and location data is sent if at least one position has reached the platform 102, this would save an additional 5 bytes.

Moving tracking mode: If the asset exceeds a speed threshold (SPEED_THRESHOLD), distance is calculated based on the last successful position sent to platform 102. If a distance threshold (DISTANCE_REPORTING) is reached, a position report is sent to platform 102. In some embodiments, this report is 9 bytes which includes course over group in steps of 45 degrees and speed under 256 km/h or 10 bytes if speed is between 256 to 2,047 km/h. If the asset stops moving for a configurable threshold (STOPPING_TIMER), the member asset 116, 120 will switch to stationary tracking mode.

Figure 4:
FIG. 4 illustrates a positional message format 400 in accordance with one embodiment.

FIG. 4 depicts an example of a positional message format.

In one embodiment, the latitude and longitude are compressed. Typically, the GPS 106 accuracy is limited to +/−8 meters 95% of the time. To fit the longitude into 22 bits of data, the GPS 106 accuracy achieved at the equator is +/−0.003' of an arc or +/−5.56 meters. Example: Latitude and longitude each need a double data type that uses 64 bits. Most existing systems send 64 bits GPS 106 reports which surpasses commercial GPS 106 accuracy and is thus a waste of data. The format of this embodiment is less accurate but matches the GPS 106 chipset used which is +/−8 meters. For example, the highest longitude coordinate is 179.99999*23301=0x3FFF83 which fit in 23 bits. For latitude the highest coordinate is 89.99999 which fits in 22 bits. Adding the polarity, the total is 47 bits with this embodiment, rather than 64 bits of previous methods.

Heading is from 0 to 359 degrees and usually needs 9 bits. In another embodiment, the heading is divided by a factor such as 45 which can fit in 3 bits. Because 45 is a factor 360, this will split the heading into 8 possibilities. The SA report will indicate if devices are North, NE, E, SE, S, SW, W, NW. The GPS 106 chipset provides one decimal point for degrees which would require 12 bits for transmitting a GPS 106 report and 12 bits to send the SA report. Having accuracy of 45 degrees is good enough in most circumstances for the user to know which direction other assets are going. Some precision is lost to achieve this reduction in the amount of data. A factor of 90 could be used to split the heading into 4 possibility (N, S, W, E) using two bits. A factor of 22.5 could be used to split the heading into 16 possibilities on 4 bits.

Typically, altitude data fits into 15 bits. In another embodiment, the altitude is reduced this to 8 bits. The higher the altitude the lower the precision, so the following scale is used:

1. 0 to 50=0 to 1,000 m (every 20 meters)
2. 51 to 230=1,050 to 10,000 m (every 50 meters)
3. 231 to 255=10.5 to 22.5 km (every 500 meters)

Note: As mentioned above, latitude and longitude are compressed since the GPS accuracy is limited to +/−8 meters 95% of the time. To fit the longitude in 22 bits of data, this is equal to an accuracy at the equator of +/−0.003' of an arc or +/−5.56 meters.

FIG. 5 provides an example of an SA report generated by the message handler 104. Multiple assets within an SA report may use the same format and add on to the same message.

Figure 6:
FIG. 6 illustrates a WaveTN device 600 in accordance with one embodiment.

FIG. 6 depicts an example screen of a subscriber asset 110. Each asset receives and parses the SA data packet from the message handler 104 and maintains a collection of member asset 116, 120 within memory. The SA information is then displayed in a data list or a radar type display. Furthermore, geofence 602 and position of interest (POI 604) are also displayed and synchronized over satellite network from the platform 102.

An SA icon 606 shows its location in relation to the subscriber asset 110.

Storing positional information: the subscriber asset 110 parses and stores positional information in memory when a new collection of positional information is received. If the COMM_ID already exists in memory, only the changed parameters are modified from the list.

For situational information purpose, the firmware on a subscriber asset calculates the bearing and distance if the member asset 116, 120 has changed to a new position. If the SA member asset 116, 120 changes more than a configurable distance, the firmware resets the bearing and distance of the SA member asset in the memory on the subscriber device.

Outdated positional information: If the device has been turned off for a long period of time or signal quality is inadequate for too long, the subscriber 108 has the option to request the full SA list from the message handler 104 or the platform 102.

When a member asset 116, 120 is in alert mode 610, real time information is shown below in an alert mode 610 when an alert icon 608 is selected on touch screen.

Figure 7:
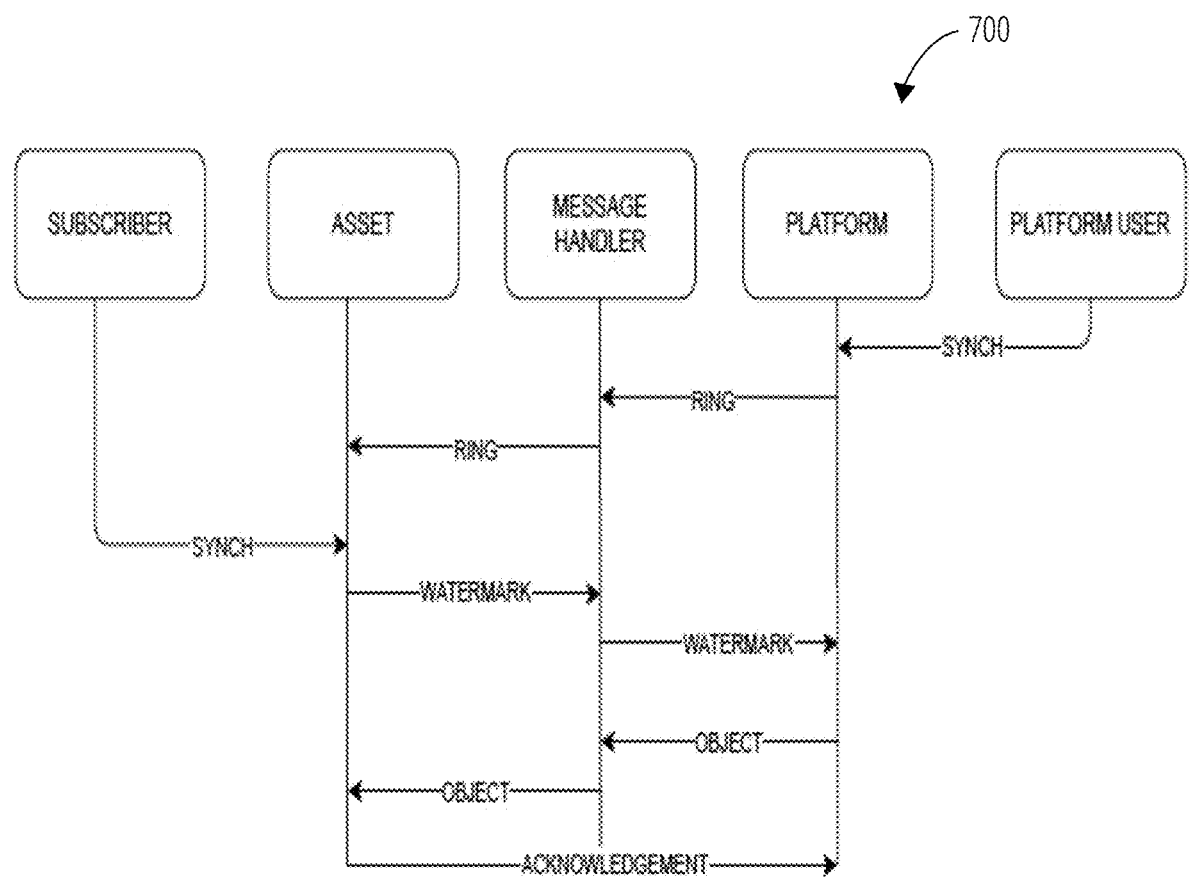
FIG. 7 illustrates an object synchronization flow chart 700 in accordance with one embodiment.

FIG. 7 depicts an object synchronization flow chart 700 of the message handler 104 as in one embodiment. In this example, a platform user synchs with a platform 102, which rings a message handler 104. The message handler 104 then rings a member asset 116, 120 which a synch is then sent from the subscriber 108 to the asset which triggers a watermark and may be then sent from the subscriber 108 or member 114 to the message handler 104 then to the platform 102. Then an object may then be sent from the platform 102 to a message handler 104 and then from a message handler 104 to a member asset 116, 120.

Acknowledgment of receiving the object may then be sent from the member asset 116, 120 to the message handler 104 and the platform 102. In other embodiments, the platform user has a choice to update based on satellite coverage.

Figure 8:
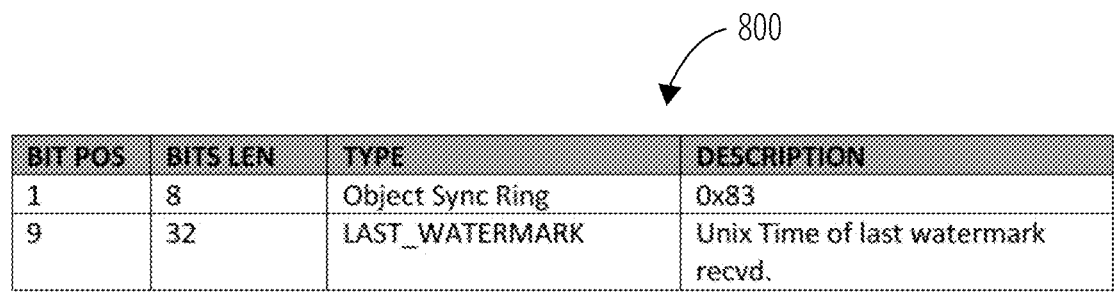
FIG. 8 illustrates an Object synchronization 800 in accordance with one embodiment.

FIG. 8 depicts a subscriber 108 to platform 102 object synchronization 800.

Address Book Synchronization

Since the protocol only sends the COMM_ID as a unique identification number, more information, such as member asset 116, 120 names, is needed for SA purposes. These are synced over the air from the platform 102 and the SA subscriber asset 110 keeps the address book in a file system that only contains subscriber 108 information. When new member 114 or subscriber 108 are added on the platform 102, this sync process must occur to complete the SA list. If an asset name is changed, a new update is synced with each member asset 116, 120.

For displaying SA details, information about each member asset 116, 120 which can be the name of the user, a code name, or application name is required. Since SA requires many updates to get real-time information, the embodiment does not send repetitive device information which would need to be stored in each member asset 116, 120. The embodiment also avoids adding new contacts manually by connecting an asset to a computer and uploading the address book using a utility. The address book sync automatically adds a new member asset 116, 120, updates the information, or deletes a contact over the air when someone on the platform makes a change. If a subscriber 108 deploys 10 more members 114 in an operation, all the information is synced to all devices in that group. This way on the SA screen, a subscriber 108 can see who is added in the operation.

Other object types can also be synced, such as POI 604 and geofence 602 using custom object sync protocols.

Since it is not possible to predict when an asset is online or offline, the embodiment provides a way to synchronize objects (like POI 604) very efficiently and using very low bandwidth. This synchronization is designed to work over a satellite network (such as the Iridium SBD network) where the data rate is only ~22 bytes per seconds when signal is excellent.

The method used to synchronize POI 604 via the objects synching can also be used for geofences 602, contacts in Master Data File, and many more.

In one example embodiment, the member asset 116, 120 or subscriber asset 110 has a sync button. This sends a watermark of the latest object downloaded to the platform 102 as per FIG. 8. If it is a new asset to be deployed, no objects are loaded and in this case the watermark value is equal to 0. When the watermark is 0, all objects must be transferred.

The platform 102 saves an action to an object table every time an object has changed. As an example, every time a new contact is added, deleted, or modified, a new record in the object is added.

When the message handler 104 receives a sync command from a device, it checks the object table and returns objects based on the watermark. The message handler 104 filters objects to limit the information being transferred. As an example, if watermark equals 0, and a new contact was created and then deleted, this POI 604 should not be transferred to this member asset 116, 120. Another example, if a new contact was created and the contact name was changed twice, only the last name change is synced. The message combines all objects together and the combined size is limited to 5,000 bytes. If more contacts need to be synced, a second combined message is possible to a maximum of 5,000 bytes.

Another way to sync objects is when a platform 102 user synchs an address book change like adding a new device. The message handler 104 sends an object ring to device (for example as per FIG. 8), device will then send a watermark back to message handler 104 and device will automatically download the address book changes based on the protocol. In certain cases, the mobile device will display a pop-up window when the sync size goes over a limit asking if sync should happen now or later. This is useful in critical operation for keeping the bandwidth for GPS 106 reporting, messaging, and SA report. If an address book sync is very large and lasts an hour, it would not be a good time to force an update during a critical operation. If the changes are minimal and not affecting the bandwidth, changes are done on the fly.

Ideally, before a mission, the subscriber 108, member 114 or platform 102 user should click on the sync button to fully update the address book, then during the operation, only small updates should happen. If a large update is triggered on the platform 102, the asset user should wait to download the information when safe.

Figure 9:
FIG. 9 illustrates an Object synchronization 900 in accordance with one embodiment.

FIG. 9 depicts a platform 102 to subscriber 108 object synchronization 900, where the platform 102 to subscriber 108 object determines the type of message and action to be completed.

FIG. 10 depicts a contact synchronization 1000 in the address book for synchronizing the data within the address book. This data may be used for adding or editing a contact within the address book. The following contact information is stored in platform 102 to subscriber 108 object synchronization 900 "DATA".

Figure 11:
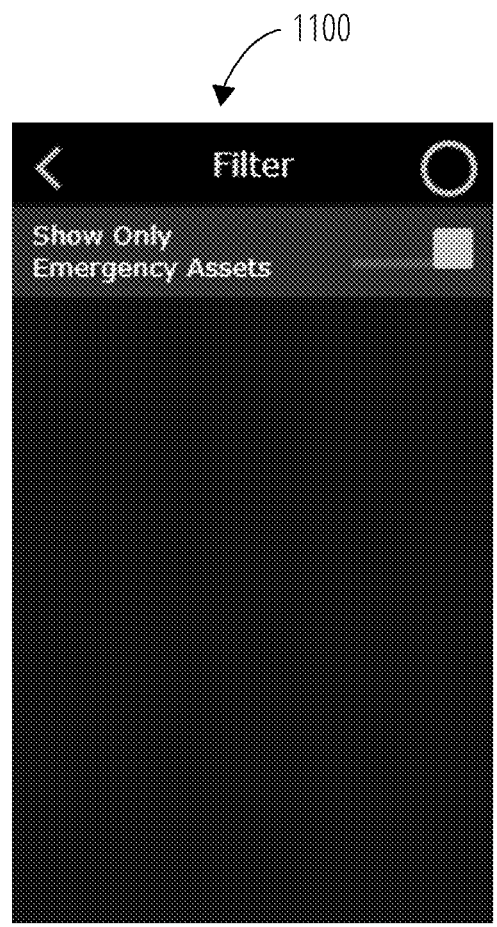
FIG. 11 illustrates a filter 1100 in accordance with one embodiment.

FIG. 11 depicts a filter 1100. In this embodiment, a user has the option to only see asset in emergency mode. In this example, a user connected to a large number of member assets 116, 120 may trigger the emergency mode allowing for the user to respond to a limited number of member assets 116, 120.

Figure 12:
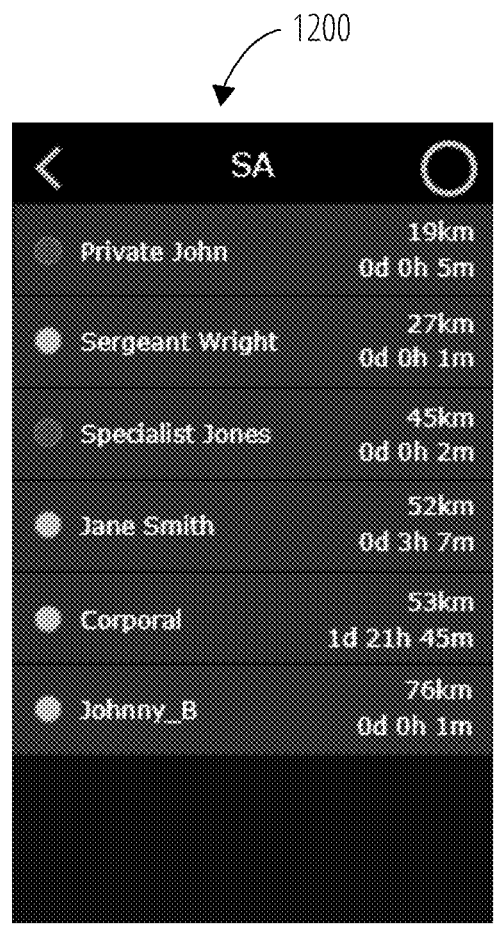
FIG. 12 illustrates a list view 1200 in accordance with one embodiment.

FIG. 12 depicts a list view 1200 of member assets 116, 120 as in one embodiment. This example displays a list similar to that of the alert mode 610, where the name, age and distance of each member asset 116, 120 are displayed.

Figure 13:
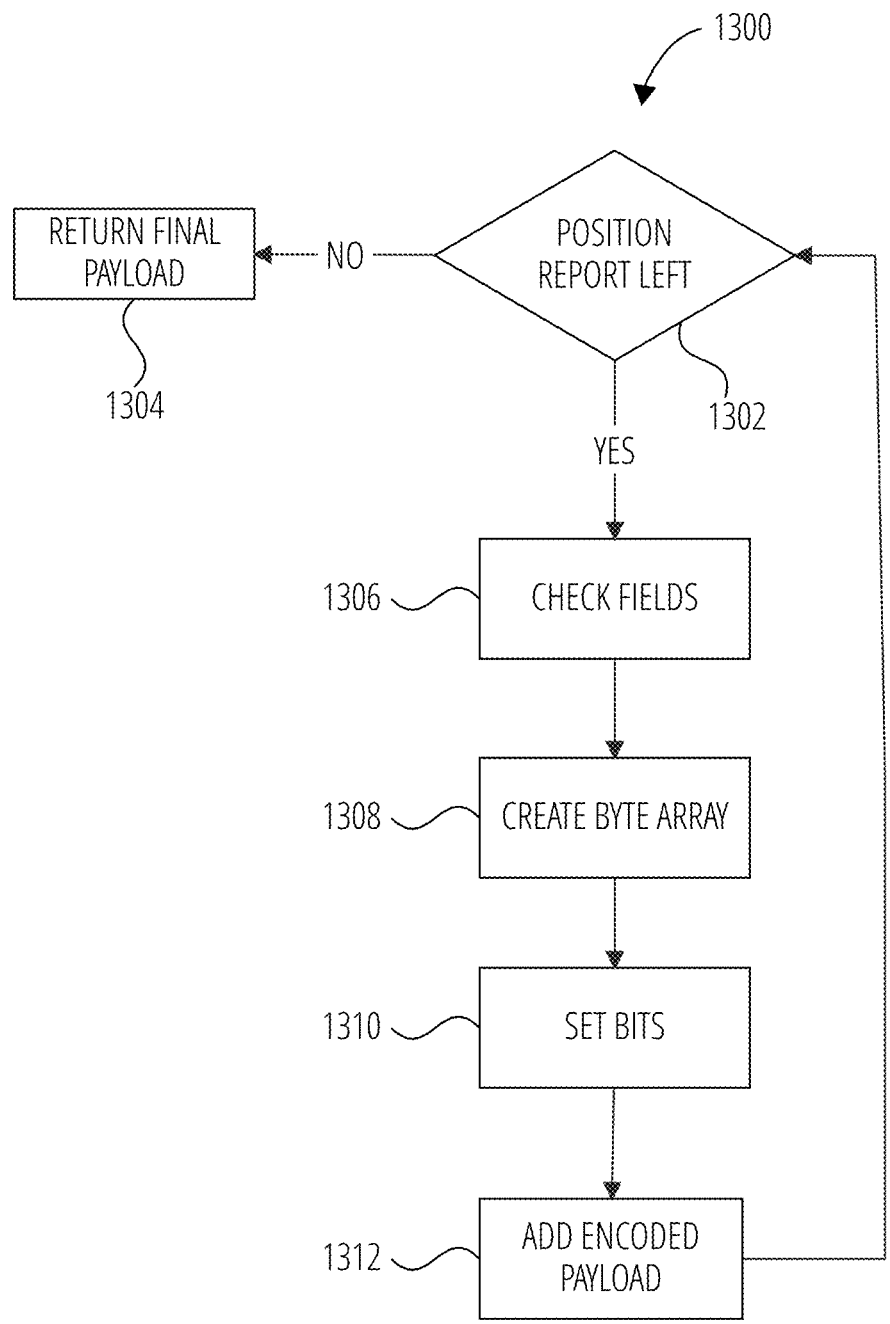
FIG. 13 illustrates a process 1300 in accordance with one embodiment.

FIG. 13 depicts a process 1300 for development of the SA message 500 from the message handler 104 message to a subscriber asset 110. This process is looped so long as there are remaining reports to send as represented by position report left 1302, otherwise the process ends with a return final payload 1304. If there is a report to send, check fields 1306 reads all fields for values, creates a byte array 1308 to store the payload, sets the appropriate bits 1310 based on the field's data and adds that payload 1312 to the message.

Figure 14:
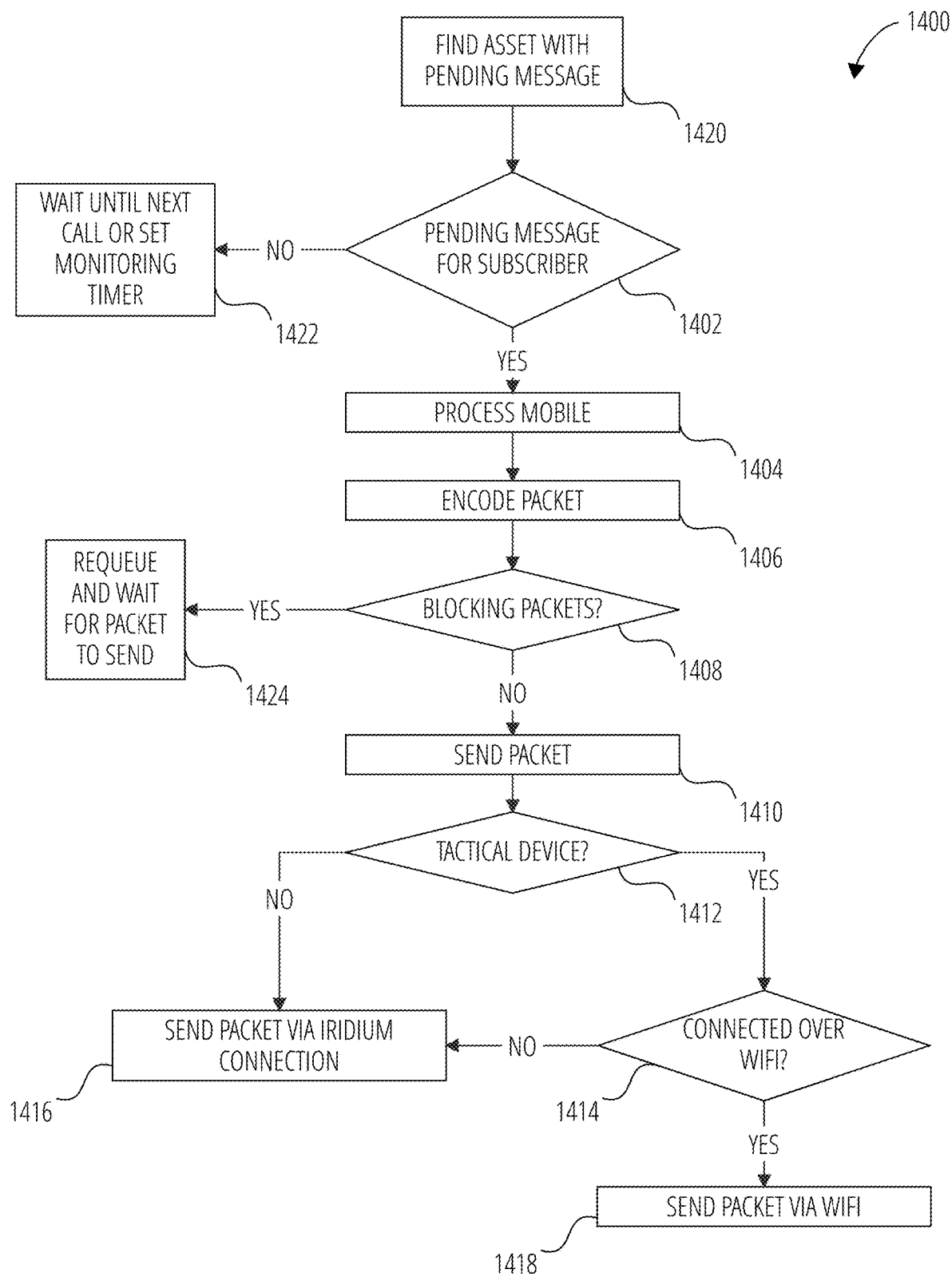
FIG. 14 illustrates a process 1400 in accordance with one embodiment.

FIG. 14 depicts a process 1400 for message handler 104 for sending any message to SA subscriber asset 110. The find asset with pending message 1420 process is looped so long as there are remaining messages to be received by a subscriber 108 as represented by pending message for subscriber 1402, otherwise the process ends with wait until next call or set monitoring timer 1422. The process mobile 1404 and encode packet 1406 collect field data and encode it for transport, similar to the process in FIG. 13, otherwise the process requeue and wait for packet to send 1424. The blocking packets 1408 checks to see if the device is responsive using device ring, similar to FIG. 8. Depending on device type and device configuration, such as whether or not the asset is a tactical device 1412, send packet 1410 may send a packet either over SBD connection or WIFI represented by send packet via Iridium connection 1416 and send packet via WIFI 1418 respectively. The tactical device 1412 will only send packet via WIFI 1418 if it is connected over WIFI 1414, otherwise the process defaults to send packet via Iridium connection 1416.

Figure 15:
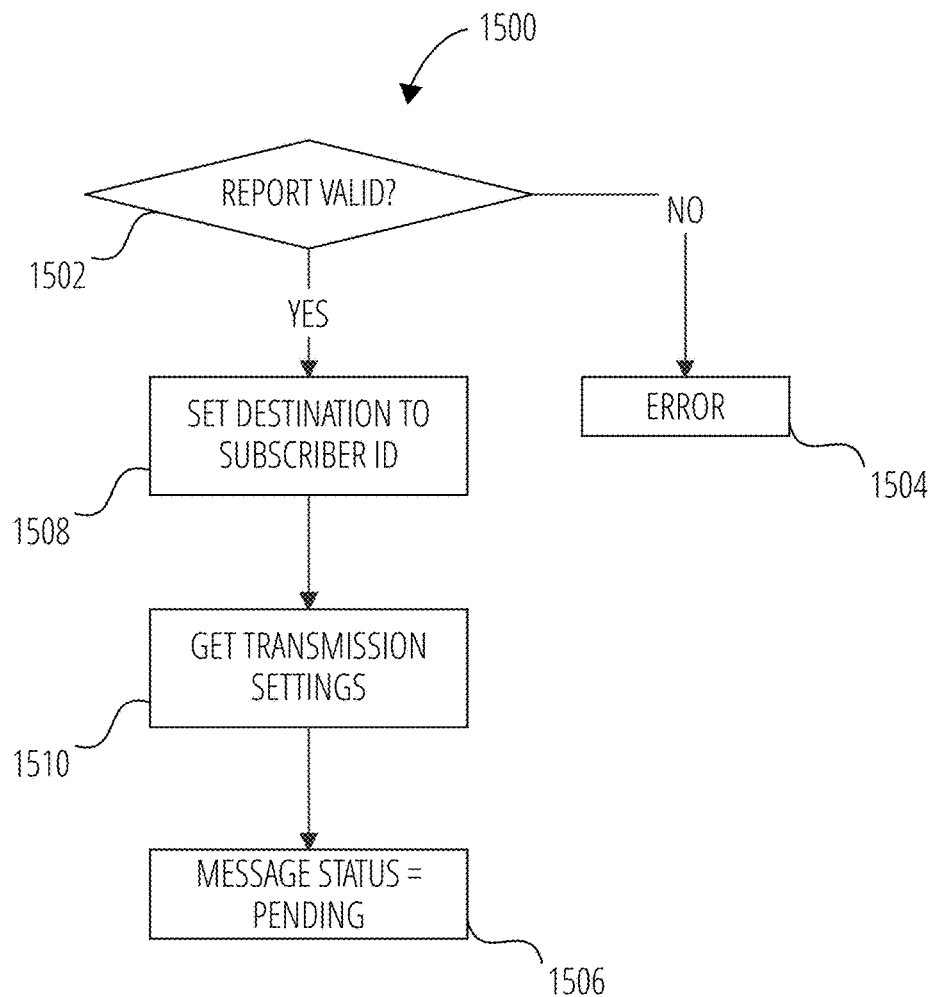
FIG. 15 illustrates a process 1500 in accordance with one embodiment.

FIG. 15 depicts the process described in blocking packets 1408, whereby the process determines validity of received reports as represented by 1502. Valid report 1502 sets a destination to a subscriber ID 1508, gets transmission settings 1510 and delivers a message status 1506 of "pending", while invalid reports end the process with an error 1504.

Figure 16:
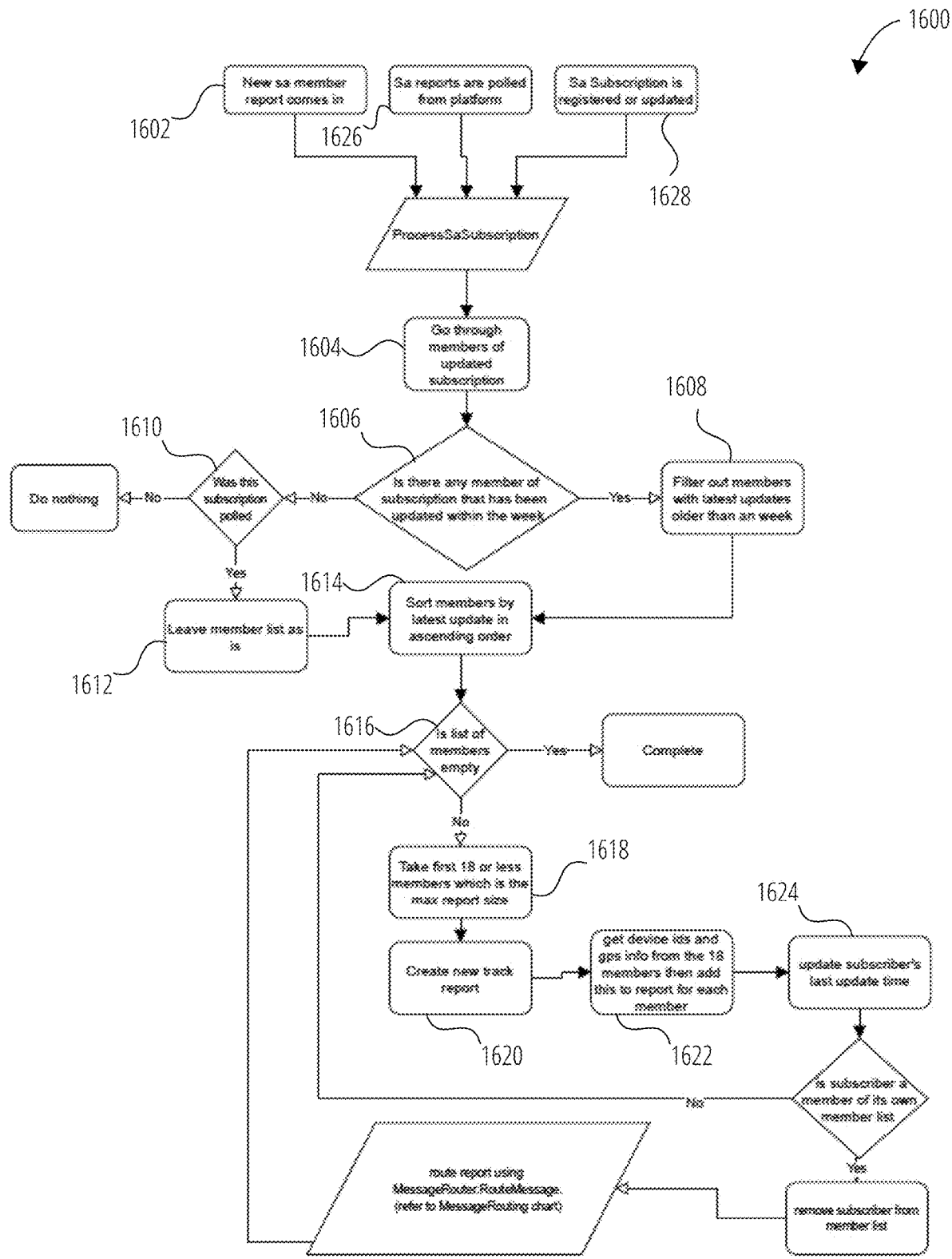
FIG. 16 illustrates a process 1600 in accordance with one embodiment.

FIG. 16 depicts a process 1600 for a message handler 104 to handle SA as a whole. The new SA report 1602 is triggered from member asset 116, 120 and reports its GPS position. The SA report polled from platform 1626 process is triggered when a user on a web platform 102 requests a report from all member assets 116, 120. The SA subscription is registered or updated 1628 when a user on web platform 102 changes and registers a new SA subscriber asset 110.

Logical steps to minimize data traffic by requesting GPS from the minimal amount of assets required include for each member of updated subscription 1604, member of subscription updated within hour 1606, filter out members with latest updates older than a week 1608, subscription polled 1610, leave member list as is 1612 and sort members by latest update in ascending order 1614. Furthermore, list is empty 1616, take first predetermined number of members 1618, create a new track report 1620, add a predetermined number of members to the track report 1622 and update subscriber's last update time 1624 comprise a similar process as described in FIG. 15.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations.

Furthermore, to the extent that the term "includes" is used in either the detailed description or the claims, such term is intended to be inclusive in a manner similar to the term "comprising" as "comprising" is interpreted when employed as a transitional word in a claim.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The exemplary embodiment was chosen and described in order to best explain the principles of the present invention and its practical application, to thereby enable others skilled in the art to best utilize the present invention and various embodiments with various modifications as are suited to the particular use contemplated.

What is claimed is:

1. A message handler for receiving and transmitting a positional information over a low bandwidth network, the message handler comprising:
   a receiver for receiving packets with the positional information from one or more assets over the network;
   a memory for storing the positional information;
   a transmitter for sending one or more situational awareness packets to said one or more assets said transmitter:
     selects the positional information based on parameters for the situational awareness packets, the selected positional information comprising at least a longitude and a latitude, a heading and an altitude for at least one mobile device;
     converts the selected information based on predetermined criteria and combine the selected information to send in the situational awareness packets based on rules; and
     sends the situational awareness packets to the one or more asset.

2. The message handler of claim 1, wherein the heading is divided by a fraction of 360 degrees in order to compress data.

3. The message handler of claim 1, wherein the longitude and the latitude are converted to 22 bits each based on predetermined ranges.

4. The message handler of claim 1, wherein the altitude is converted to 8 bits based on predetermined ranges.

5. The message handler of claim 4, wherein the altitude is converted based on 3 predetermined ranges.

6. The message handler of claim 5, wherein said ranges are not linear.

7. The message handler of claim 1, wherein most recent position information is sent first in the situational awareness packets.

8. The message handler of claim 1, wherein the position information is received from an asset only at predetermined intervals.

9. The message handler of claim 1, wherein the position information is received from an asset if said asset has moved more than a predetermined distance.

* * * * *